United States Patent [19]

Nishi et al.

[11] Patent Number: 5,505,366
[45] Date of Patent: Apr. 9, 1996

[54] METHOD FOR MOUNTING ELECTRONIC DEVICES

[75] Inventors: Toshio Nishi, Fukuoka; Yoshiyuki Wada, Onojo; Eigo Kadokami; Seiichi Yoshinaga, both of Kasuga, all of Japan

[73] Assignee: Matsushita Electric Industrial Co., Ltd., Osaka, Japan

[21] Appl. No.: 262,805

[22] Filed: Jun. 20, 1994

[30] Foreign Application Priority Data

Jun. 23, 1993 [JP] Japan .................................. 5-151844

[51] Int. Cl.⁶ .................................................. H05K 3/30
[52] U.S. Cl. ............................ 228/207; 228/217; 228/253; 148/25
[58] Field of Search ................................. 228/207, 217, 228/223, 253, 254, 180.22; 148/25

[56] References Cited

U.S. PATENT DOCUMENTS

| | | | |
|---|---|---|---|
| 4,428,780 | 1/1984 | Shedroff | 148/25 |
| 4,495,007 | 1/1985 | Zado | 148/25 |
| 4,919,731 | 4/1990 | Iyogi et al. | 148/25 |
| 5,167,729 | 12/1992 | Takemoto et al. | 148/25 |

*Primary Examiner*—Samuel M. Heinrich
*Attorney, Agent, or Firm*—Panitch Schwarze Jacobs & Nadel

[57] ABSTRACT

The present invention relates to a method for mounting electronic devices on a substrate by using soldering with flux which contains materials capable of ion-exchanging or ion-catching so as to catch impurity ions which seep from a solder portions, and thereby it is not necessary to have a fusing step and a cleaning step in an plating process of the method.

5 Claims, 4 Drawing Sheets

METHOD FOR MOUNTING ELECTRONIC DEVICES

FIELD OF THE INVENTION AND RELATED ART STATEMENT

1. Field of the Invention

The present invention relates to a method for mounting electronic devices by soldering between terminals of the electronic devices and lead conductors of a wiring pattern on the substrate.

2. Description of the Related Art

General electronic devices, such as IC (Integrated Circuit), LSI (Large Scale Integrated Circuit), resistor, capacitor and the like are mounted on a substrate by soldering between such electronic devices and lead conductors of a wiring pattern on the substrate.

Hereafter, the conventional method for mounting the electronic devices on the substrate are described with reference to the accompanying drawings.

FIGS. 3A to 3D show respective steps in a plating process of the conventional method for mounting electronic devices on the substrate 1 in order. In an initial step shown in FIG. 3A, the substrate 1 is coated by a copper layer 2. Glass-epoxy, that is epoxy resin including glass fiber, is in general use as a materials for the substrate 1. Next, a plating resist layer 3 is formed on the copper layer 2 except the lead conductors 2a of the wiring pattern thereby exposing the lead conductors 2a as shown in FIG. 3B.

In a next step shown in FIG. 3C, solder portions 4 are formed on the exposed lead conductors 2a of the copper layer 2 by using an electroplating means using plating solution. Alloy of Pb (Lead) and Sn (Tin) is in general use as a material for the solder portions 4.

After the step shown in FIG. 3C, the plating resist layer 3 is removed as shown in FIG. 3D, and the unnecessary copper layer 2 is removed to retain the wiring pattern by using an etching means. As a result, the plated solder portions 4 are formed on the lead conductors 2a of the wiring pattern of the copper layer 2 as shown in FIG. 4A.

FIGS. 4A to 4C show the soldering process in the conventional method for mounting the electronic devices on the substrate 1. FIG. 4A show the solder portions 4 on the lead conductors 2a which are retained on the substrate 1 after operating the above-mentioned plating process.

In an initial step of the soldering process, the plated solder portions 4 on the lead conductors 2a are treated by a fusing so as to change the solder portions 4 into more dense state by means of heating and melting the plated solder portions 4. FIG. 4B shows the fused solder portions 4 on the substrate 1 after operating the fusing. Since the fused solder portions 4 are melted in the fusing operation, the surface of the fused solder portions 4 are changed to have a curved-surface as a semicircular shape because of surface tension of the melted solder portions 4.

As mentioned above, the substrate 1 for mounting electronic devices is completed by forming the fused solder portions 4 on the lead conductor 2a of the wiring pattern after operating the fusing. In the next step, terminals 6 of the electronic devices 5 are put on the fused solder portions 4 as shown in FIG. 4C after coating a layer of flux 7 on the surface of the fused solder portions 4. Then, the electronic devices 5 disposed on the fused solder portions 4 are conveyed to a furnace, and the fused solder portions 4 are heated to be melted for soldering. After heating, the melted solder portions 4 are cooled to a solid state. As a result, the terminals 6 of the electronic devices 5 are electrically connected by soldering to the lead conductors 2a of the wiring pattern on the substrate 1.

The above-mentioned conventional method for mounting the electronic devices 5 on the substrate 1 has the following problems. In the aforementioned plating process shown in FIG. 3C, the plating solution is used for forming the solder portions 4 by the electroplating means. Since the plating solution contains impurity ions, such as chlorine ions, sodium ions, ammonium ions, bromine ions and the like, the impurity ions are mixed in the solder portions 4 at the plating step. Thereby, these impurity ions seep from the fused solder portions 4 at the fusing seep shown in FIG. 4B.

If the impurity ions which seep from the fused solder portions 4 are left on the surface of the substrate 1, such impurity ions have a bad influence to the substrate 1, for example, the substrate 1 is corroded in a long time, and/or a migration which causes short circuit is generated in the wiring pattern slowly. In order to remove such impurity ions, the conventional method requires a cleaning seep for cleaning the substrate 1 by using cleaning liquid, such as Flon liquid or the harmful washing liquid. Therefore, the conventional method for mounting the electronic devices must have the cleaning step in the soldering process, as well as had a bad influence to an environment etc. because of the using of the Flon liquid or the harmful liquid in the cleaning step.

And further, as shown in FIG. 4C, when the terminals 6 of the electronic devices 5 are disposed on the solder portions 4, the electronic devices 5 are apt to slip from the solder portions 4 as indicated by chain lines in FIG. 4C because the solder portions 4 are formed to have semicircular shape caused by the surface tension of the melted solder portions 4 in the fusing operation.

SUBJECT AND SUMMARY OF THE INVENTION

An object of the present invention is to provide a method for mounting electronic devices on a substrate, which method does not need the cleaning step using the cleaning liquid, such as Flon liquid or harmful washing liquid, and which is capable of solving the problem that electronic devices are apt to slip from the solder portions.

In order to achieve the above-mentioned object, a method for mounting electronic devices comprises the steps of:

forming a plating resist layer on a substrate which is coated by a copper layer, forming a solder portions on the substrate by plating method using plating solution, removing the plating resist layer, removing the copper layer except a wiring pattern including portions on the solder portions, coating a flux including ion trap materials to a surface of the solder portions without fusing the solder portions, disposing terminals of electronic devices on the solder portions which is coated by the flux, heating and melting the solder portions, and cooling and solidifying the solder portions to connect between the terminals of the electronic devices and the solder portions, after heating and melting the solder portions.

While the novel features of the invention are set forth particularly in the appended claims, the invention, both as to

It will be recognized that some or all of the Figures are schematic representations for purposes of illustration and do not necessarily depict the actual relative sizes or locations of the elements shown.

DESCRIPTION OF THE PREFERRED EMBODIMENTS

Hereafter, the present invention is elucidated in more detail with reference to the preferred embodiment shown in the attached drawings.

FIGS. 1A to 1E show elevation cross-sectional views of a substrate 10 at the respective steps of a plating process in a method performed in accordance with the present invention. FIGS. 2A to 2D show elevation cross-sectional views of the substrate 10 at the respective steps of a soldering process following the plating process.

Figure 1A:
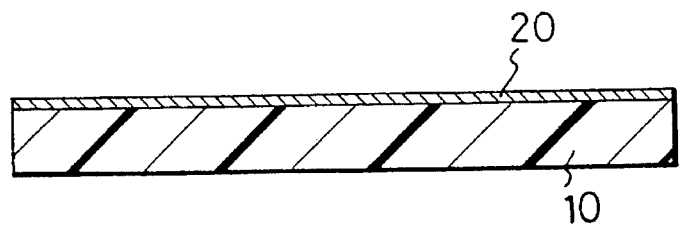
FIG. 1A is a schematic cross-sectional view showing a substrate in an initial step of a plating process in a method performed in accordance with the present invention.

In an initial step of the plating process shown in FIG. 1A, a copper layer 20 is stuck to the substrate 10 by such coating step that the copper layer 20 is pressed to the semi-hardened substrate 10 by squeeze rolls with high pressure in a high temperature state. Glass-epoxy resin, that is epoxy resin including glass fiber, is used as a material for the substrate 10. In a step shown in FIG. 1B following the coating step, a plating resist layer 30 is formed on the copper layer 20 except lead conductors 21 of the wiring pattern, thereby the lead conductors 21 are exposed as shown in FIG. 1B.

The plating resist layer 30 is formed in following steps:

(1) lightly coating on the substrate 10 to plating resist solution which is photo-curing type, (2) covering the substrate 10 by a negative film to hide portions to be plated, (3) irradiating light on the substrate 10 to cure the irradiated plating resist solution, and (4) washing off the plating resist solution, which is kept in a liquid state, from the substrate 10 by using alcohol etc. and finally the plating resist layer 30 is retained on the substrate 10.

Figure 1B:
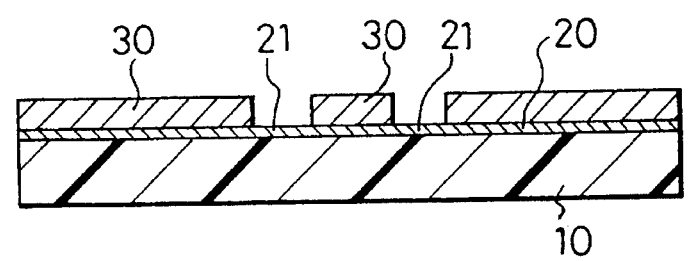
FIG. 1B is a schematic cross-sectional view showing the substrate in a step of the plating process following the step shown in FIG. 1A.
Figure 1C:
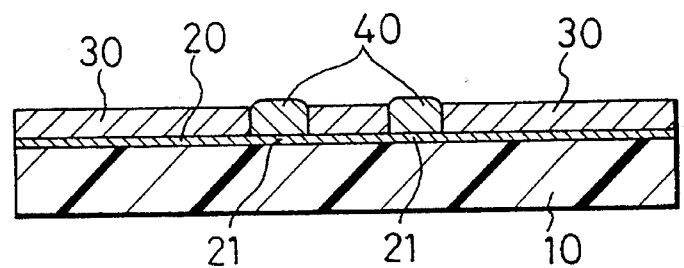
FIG. 1C is a schematic cross-sectional view showing the substrate in a step of the plating process following the step shown in FIG. 1B.

After forming the plating resist layer 30 shown in FIG. 1B solder portions 40 are formed by an electroplating using plating solution on the exposed lead conductors 21 of the copper layer 20 as shown in FIG. 1C. Since the plating solution including impurity ions, such as chloride ions, sodium ions, ammonium ions, bromide ions and the like, is used for forming the solder portions 40, such impurity ions are mixed in the solder portions 40. The solder portions 40 are made of alloy of Pb (Lead) and Sn (Tin)

Figure 1D:
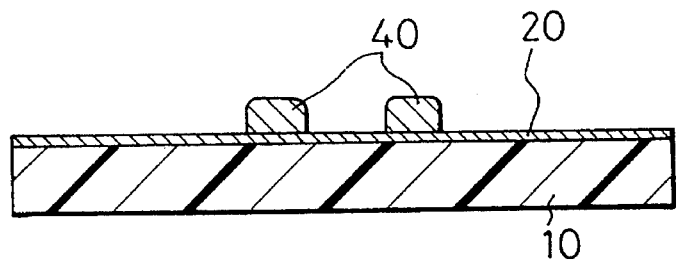
FIG. 1D is a schematic cross-sectional view showing the substrate in a step of the plating process following the step shown in FIG. 1B.
Figure 1E:
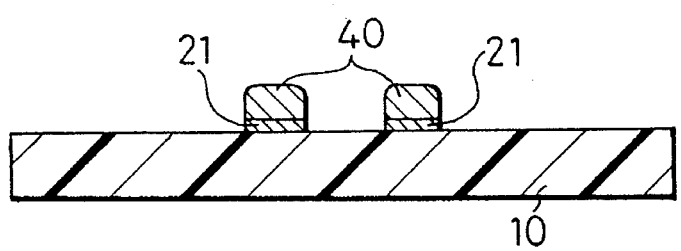
FIG. 1E is a schematic cross-sectional view showing the substrate in a step of the plating process following the step shown in FIG. 1D.

After the plating step shown in FIG. 1C, the plating resist layer 30 is removed from the substrate 10 as shown in FIG. 1D. Next, the unnecessary copper layer 20 is removed from the substrate 10 to retain the wiring pattern by an etching means using etching solution, such as iron (III) chloride ($FeCl_3$), as shown in FIG. 1E. As a result, the plated solder portions 40 are formed on the lead conductors 21 of the wiring pattern of the copper layer 20, and thereby the plating process is finished.

Figure 2A:
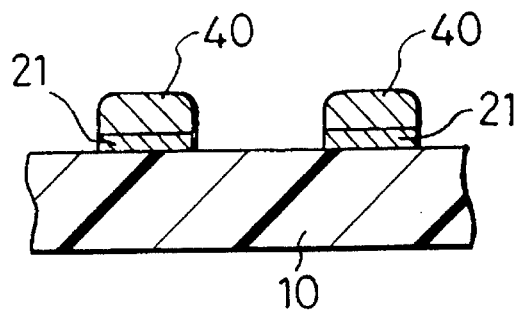
FIG. 2A is a schematic cross-sectional view showing the substrate in an initial step of a soldering process performed in accordance with the present invention.

Next, the soldering process is operated as shown in FIGS. 2A to 2D. FIG. 2A shows the substrate 10 which has been treated by the above-mentioned plating process.

Figure 2B:
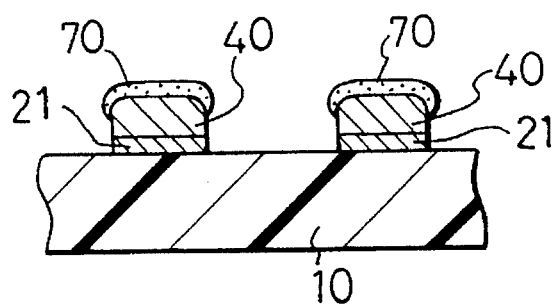
FIG. 2B is a schematic cross-sectional view showing the substrate in a step of the soldering process following the step shown in FIG. 2A.

As shown in FIG. 2B, a layer of flux 70 is coated on a surface of the plated solder portions 40 by using a known printing method, such as a screen printing, at the initial step of the soldering process. Since the plated solder portions 40 are not treated by a fusing, the plated solder portions 40 are kept to have a flat top-surface as shown in FIGS. 2A and 2B. As a result, a proper quantity of the flux 70 is easily coated on the solder portions 40.

The flux 70 contains an ion trap materials having chemical properties which catch floating ions adjacent to the flux 70. The ion trap materials consists of the materials selected from the materials of an ion-exchanger or an ion-catcher.

The ion-exchanger consists of an anion-exchanger and a cation-exchanger. The anion-exchanger is prepared by hydroxide of metal oxide (e.g. $Bi_6O_6(OH)_6$) or metal oxide or (e.g. $Mg_4.5Al_2(OH)_{13}CO_3.mH_2O$).

And, the cation-exchanger is prepared by sulfonic acid ($RSO_3H$) or carboxylic acid (RCOOH). The ion-catcher is prepared by ester having unsaturated double linkage of methacrylic group or acrylic group. The ester having the methacrylic group has the following formula:

$$CH_2=C(CH_3)COOCH_2CH_2OH,$$
(methacrylate)

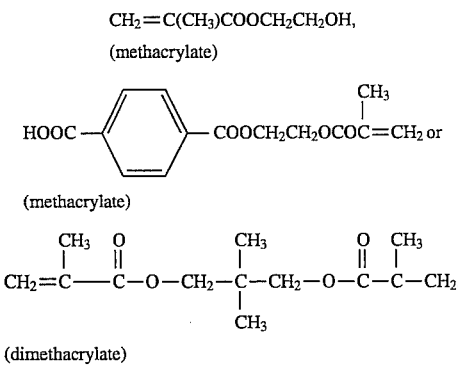
(methacrylate)

$$CH_2=C\underset{CH_3}{\overset{CH_3}{|}}\!\!-\!\!\underset{}{\overset{O}{\overset{\|}{C}}}\!\!-\!\!O\!\!-\!\!CH_2\!\!-\!\!\underset{CH_3}{\overset{CH_3}{\underset{|}{C}}}\!\!-\!\!CH_2\!\!-\!\!O\!\!-\!\!\overset{O}{\overset{\|}{C}}\!\!-\!\!\underset{}{\overset{CH_3}{\overset{|}{C}}}\!\!=\!\!CH_2.$$
(dimethacrylate)

The ester having the acrylic group has the following formula:

$$CH_2=CH-COOCH_2CH_2OH,$$
(acrylate)

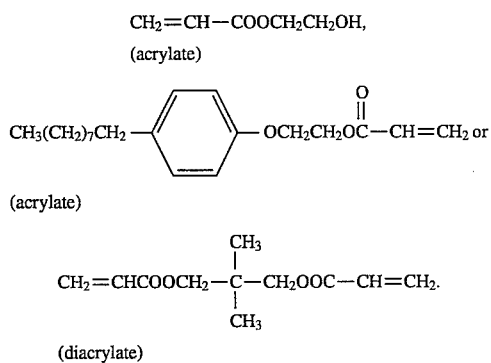
(acrylate)

$$CH_2=CHCOOCH_2-\underset{CH_3}{\overset{CH_3}{\underset{|}{\overset{|}{C}}}}-CH_2OOC-CH=CH_2.$$
(diacrylate)

Such materials for the ion trap materials have been used in the waste water treatment.

Figure 2C:
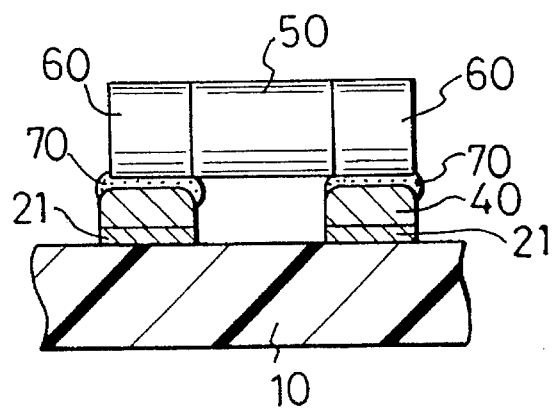
FIG. 2C is a schematic cross-sectional view showing the substrate in a step of the soldering process following the step shown in FIG. 2B.

As shown in FIG. 2C, the electronic devices 50 are put on the substrate 10 so as to contact between the terminals 60 of the electronic devices 50 and the solder portions 40. In this step shown in FIG. 2C, since the solder portions 40 have a flat top-surface, the electronic devices 50 can be stably disposed on the solder portions 40.

Figure 2D:
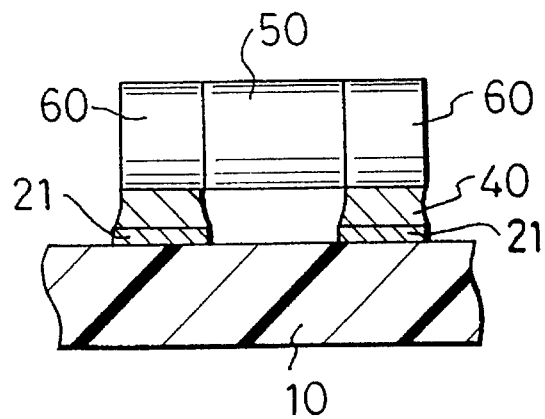
FIG. 2D is a schematic cross-sectional view showing the substrate in a step of the soldering process following the step shown in FIG. 2C.
Figure 3A:
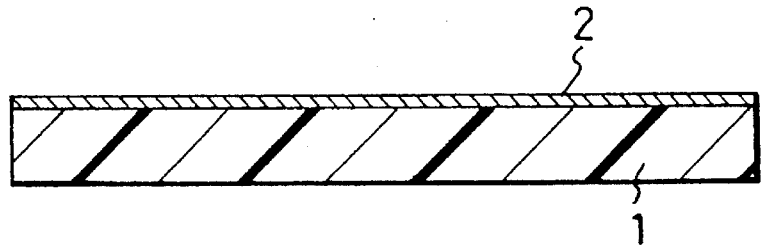
FIG. 3A is the schematic cross-sectional view showing the substrate in the initial step of the plating process in the conventional method for mounting the electronic devices on the substrate.
Figure 3B:
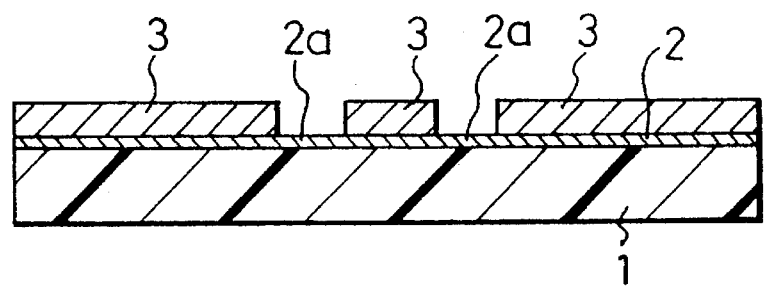
FIG. 3B is the schematic cross-sectional view showing the substrate in the step of the plating process following the step shown in FIG. 3A.
Figure 3C:
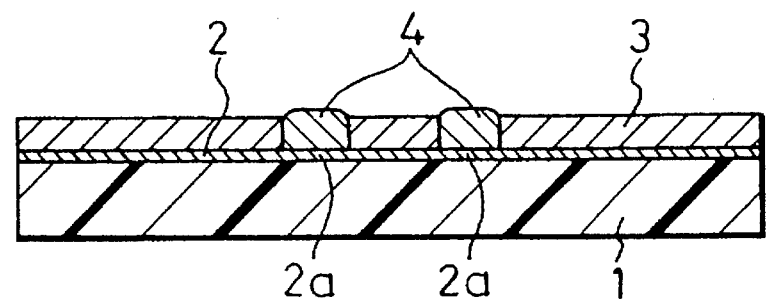
FIG. 3C is the schematic cross-sectional view showing the substrate in the step of the plating process following the step shown in FIG. 3B.
Figure 3D:
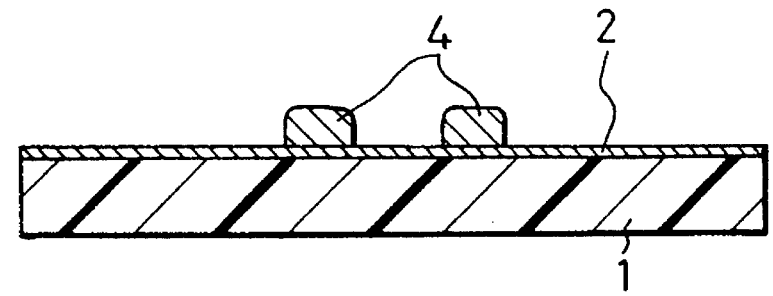
FIG. 3D is the schematic cross-sectional view showing the substrate in the step of the plating process following the step shown in FIG. 3B.
Figure 4A:
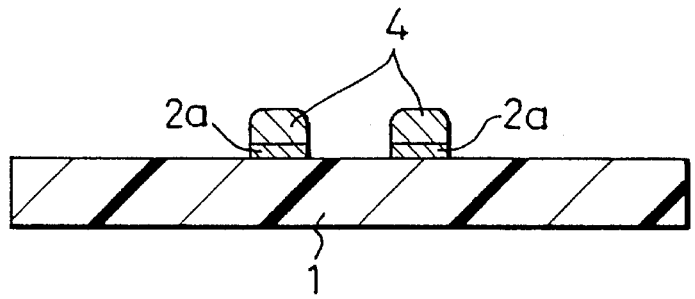
FIG. 4A is the schematic cross-sectional view showing the substrate in the initial step of the soldering process in the conventional method for mounting the electronic devices on the substrate.
Figure 4B:
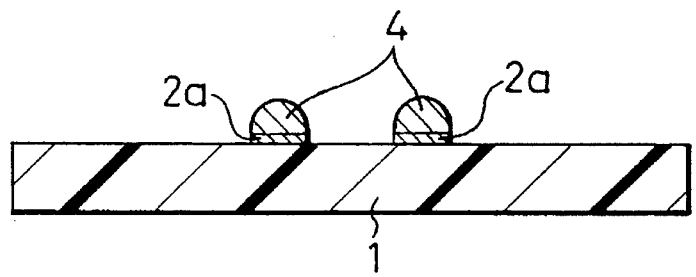
FIG. 4B is the schematic cross-sectional view showing the substrate in the step of the soldering process following the step shown in FIG. 4A.
Figure 4C:
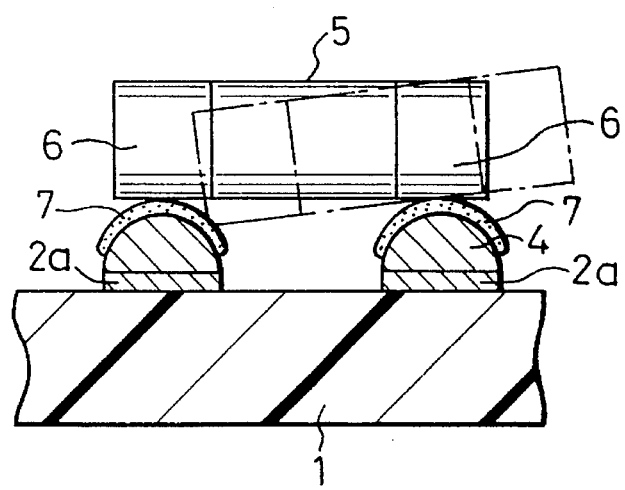
FIG. 4C is the schematic cross-sectional view showing the substrate in the step of the soldering process following the step shown in FIG. 4B.

Next, the substrate 10 with the electronic devices 50 is conveyed into a furnace, and the solder portions 40 are heated to be melted in the furnace. The temperature of the furnace is kept in 200° C.–230° C., and the heating time for the substrate 10 is about 60 seconds. As a result, the terminals 60 of the electronic devices 50 and the lead conductors 21 of the copper layer 20 of the circuit pattern are electrically connected each other as shown in FIG. 2D. In this heating step, the solder portions 40 are changed into more dense state, and the impurity ions seep from the solder portions 40. In the furnace, upon seeping of the impurity ions seep from the surface of the solder portions 40, the impurity ions are caught by the above-mentioned ion trap materials in the flux 70. One example of the reaction formulas for ion-exchanging is as follows:

A—OH(anion-exchange resin)+Cl⁻(impurity ions)

→A—Cl+OH⁻ and

B—H(cation-exchange resin)+Na⁺(impurity ions)

→B—Na+H⁺· and thereby

OH⁻+H⁺→H₂O, wherein A—OH represents one example of the anion-exchange resin, and B—H represents one example of the cation-exchange resin. These deposits, A—Cl and B—Na, do not have a bad influence to the substrate 10 or the wiring pattern etc. because the A—Cl and B—Na do not make the corrosion of the substrate 10 and the migration of the wiring pattern.

In case of the ester having unsaturated double linkage of methacrylic group as the ion-catcher, the reaction formula is follows:

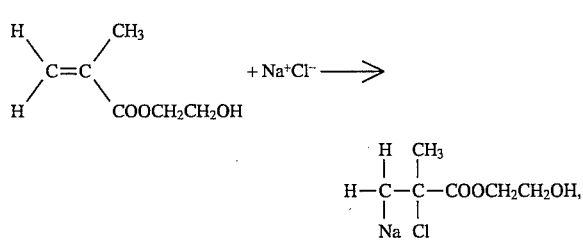

wherein $CH_2=C(CH_3)COOCH_2CH_2OH$ represents one example of the ion-catcher, and Na⁺ and Cl⁻ are impurity ions. The deposits do not have a bad influence to the substrate 10 or the wiring pattern etc.

In case of the ester having unsaturated double linkage of acrylic group as another ion-catcher, the reaction formula is follows:

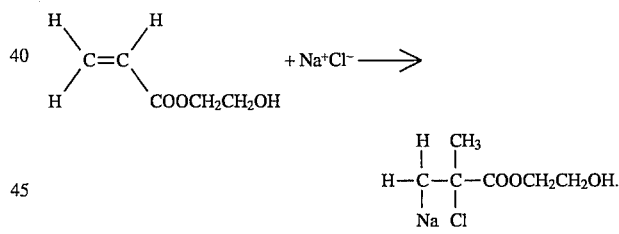

The following reaction formulas show the case of chloride ions and bromide ions as the impulity ions:

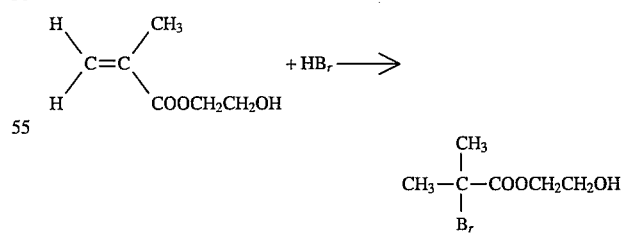

and

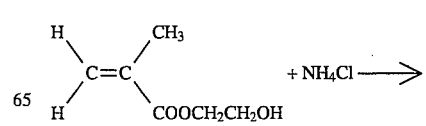

-continued

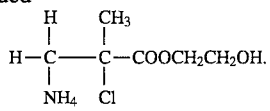

Since the impurity ions are caught by the ion trap materials in such reaction, the above-mentioned method for mounting electronic devices 50 on the substrate 10 prevents the migration of the lead conductors 21 and/or the corrosion of the substrate 10.

According to the present invention, since it is not necessary to operate a fusing step for the solder portions, the solder portions retain flat top-surface before the soldering step, thereby preventing electronic devices from slipping out of the solder portions in the soldering step.

And further, according to the present invention, since the impurity ions, which seep from the solder portions, are caught by the ion trap materials In the flux, the migration of the wiring pattern and the corrosion of the substrate are not generated, and thereby a cleaning step is not necessary.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A method for mounting electronic devices comprising the steps of:

forming a copper layer (20) on a substrate (10), forming a plating resist layer (30) on the copper layer (20), forming solder portions (40) on said copper layer (10) by a plating method using plating solution, removing said plating resist layer (30), removing said copper layer (20) except for a wiring pattern including portions on said solder portions (40), coating flux (70) including ion trap materials to a surface of said solder portions (40) without fusing said solder portions (40), disposing terminals (60) of electronic devices (50) on said solder portions (40) which is coated by said flux (70), heating and melting said solder portions (40), and cooling and solidifying said solder portions (40) to provide a connection between said terminals (60) of said electronic devices (50) and said solder portions (40), after heating and melting said solder portions (40).

2. The method for mounting electronic devices in accordance with claim 1, wherein said ion trap materials include an ion-catcher having an ion-exchanger.

3. The method for mounting electronic devices in accordance with claim 1, wherein said ion trap materials include an ion-catcher.

4. The method for mounting electronic devices in accordance with claim 2, wherein said 1on-exchanger consists of an anion-exchange resin and a cation-exchange resin.

5. The method for mounting electronic devices in accordance with claim 3, wherein said ion-catcher consists of an ester having an unsaturated double linkage of methacrylic group or acrylic group.

* * * * *